United States Patent [19]

Lankford

[11] Patent Number: 5,072,358
[45] Date of Patent: Dec. 10, 1991

[54] PROCESS CONTROLLER

[75] Inventor: Dale H. Lankford, Miamisburg, Ohio

[73] Assignee: Daytronic Corporation, Miamisburg, Ohio

[21] Appl. No.: 490,869

[22] Filed: Mar. 9, 1990

[51] Int. Cl.$^5$ .............................................. G06F 3/05
[52] U.S. Cl. ................................... 364/178; 341/110; 341/145
[58] Field of Search .................. 364/178, 180, 182; 318/636, 592; 341/110, 145

[56] References Cited

U.S. PATENT DOCUMENTS 4,503,421 3/1985 Hareyame et al. .................. 341/145
4,673,916 6/1987 Kitamura et al. .................... 364/178
4,868,571 9/1989 Inamasu ............................... 341/145

OTHER PUBLICATIONS

MN5246 A/D Converter, data sheet published by Micro Networks, Apr. 1988, pp. 5-85 through 5-91.

Primary Examiner—Jerry Smith
Assistant Examiner—Patrick Muir

[57] ABSTRACT

A process controller using a 16-bit microprocessor connected to a 10-bit analog to digital converter and a 10-bit digital to analog converter produces process correction signals having 16-bit accuracy. A raw sample of a process measurement signal is digitized to produce a first approximation of a process variable. The first approximation is stored and also reconverted to analog form as a processed analog sample. The processed analog sample is compared against the raw sample to generate and error signal corresponding to the difference. The error signal is amplified and digitized to produce a digitized refinement. The first approximation and the refinement are used to create first and second stage data words and a tabulated error value which are combined to produce enhanced digital data. Thereafter the enhanced digital data is used for calculation of a process correction command. The process correction command then is converted into high order and low order correction words, which are converted into coarse and fine analog correction signals. The coarse and fine analog correction signals are separately amplified and summed to produce a highly accurate control signal for the process.

8 Claims, 3 Drawing Sheets

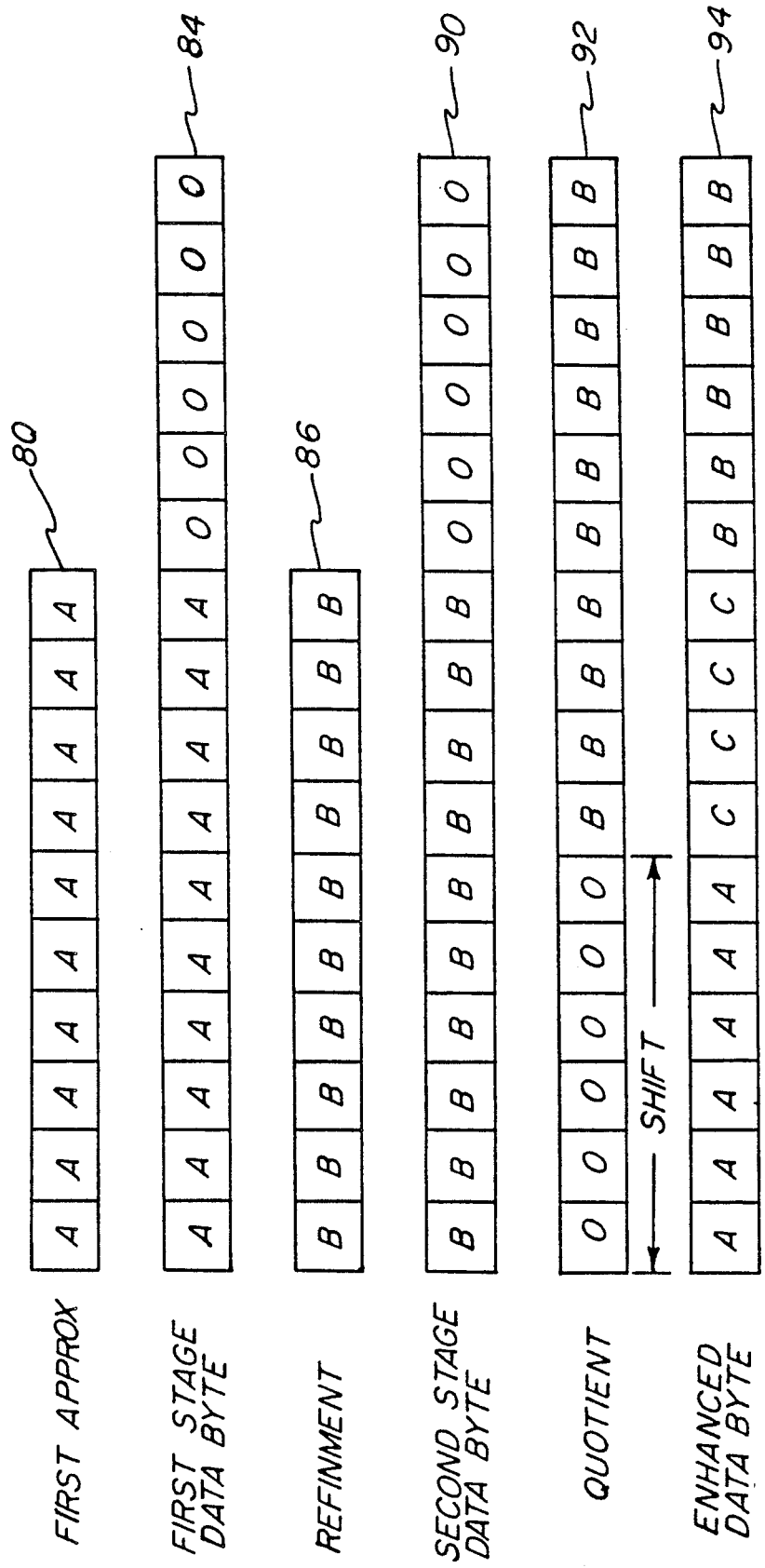

PROCESS CONTROLLER

BACKGROUND OF THE INVENTION

This invention relates to the field of process control and more particularly to a low-cost process controller having high accuracy analog to digital and digital to analog signal conversion. Prior art digitally driven industrial process controllers have employed commercially available 8-bit microprocessors interfaced to 8-bit peripheral equipment. More recently, 16-bit microprocessors have become available, but 8-bit peripheral equipment has continued to remain the low cost standard.

In typical prior art process control systems analog process measurement signals have been applied to 8-bit analog to digital signal converters which have generated process status information into 8-bit bytes for application to an 8-bit data bus servicing an appropriately selected microprocessor. The status information has been processed by the microprocessor in either 16-bit or 8-bit format for generation of appropriate process control signals. The process control signals have then been placed on the 8-bit data bus and transmitted to an 8-bit digital to analog converter for conversion to analog form. Such an arrangement is limited to 8-bit control accuracy. While some reasonably economical 10-bit and 12-bit integrated circuits are now available for supporting process control applications, they afford only modest improvements in control accuracy. Thus, there exists a need to provide an economical process controller which is able to make full use of the computing power of a 16-bit microprocessor.

SUMMARY OF THE INVENTION

In accordance with the present invention, low-cost, high accuracy, digitally driven process control is achieved by converting an analog measurement signal to digital form in two steps. The first step generates digital information which is a first approximation of a raw sample of an analog input signal. This first approximation is reconverted to analog form as a processed analog signal. The processed analog signal is then compared with the raw sample of the input signal to generate an analog error signal, which in turn is amplified by a predetermined factor. Second step conversion proceeds by taking the amplified error signal and converting it into digital form, again at the accuracy of the first step. This provides a digital refinement which is applied to the microprocessor, appropriately shifted and added to the first approximation to produce an enhanced digital representation of the analog measurement signal. The enhanced digital representation is used by the microprocessor to generate a process correction command in the form of two 10-bit correction words. The words in this pair are separately converted to analog form, amplified by different amounts and summed to produce an analog control signal for the process.

In one embodiment of the invention a process controller employs a 16-bit microprocessor, a commercially available 10-bit serial output analog to digital converter and a 10-bit customized digital to analog converter. This embodiment uses a sample and hold circuit to provide the raw samples of the analog input signals. The D/A converter has a latch arrangement which supplies binary data signals to a resistance ladder. The disclosed arrangement has a microprocessor control program which compensates for D/A conversion errors through use of a table lookup routine.

It is therefore an object of this invention to provide low-cost, high accuracy digitally driven process control.

It is another object of this invention to enable economic and efficient utilization of a 16-bit microprocessor for control of a physical process.

Other and further objects and advantages of the invention will be apparent from the following description, the accompanying drawings and the appended claims.

DESCRIPTION OF THE PREFERRED EMBODIMENT

Figure 1:
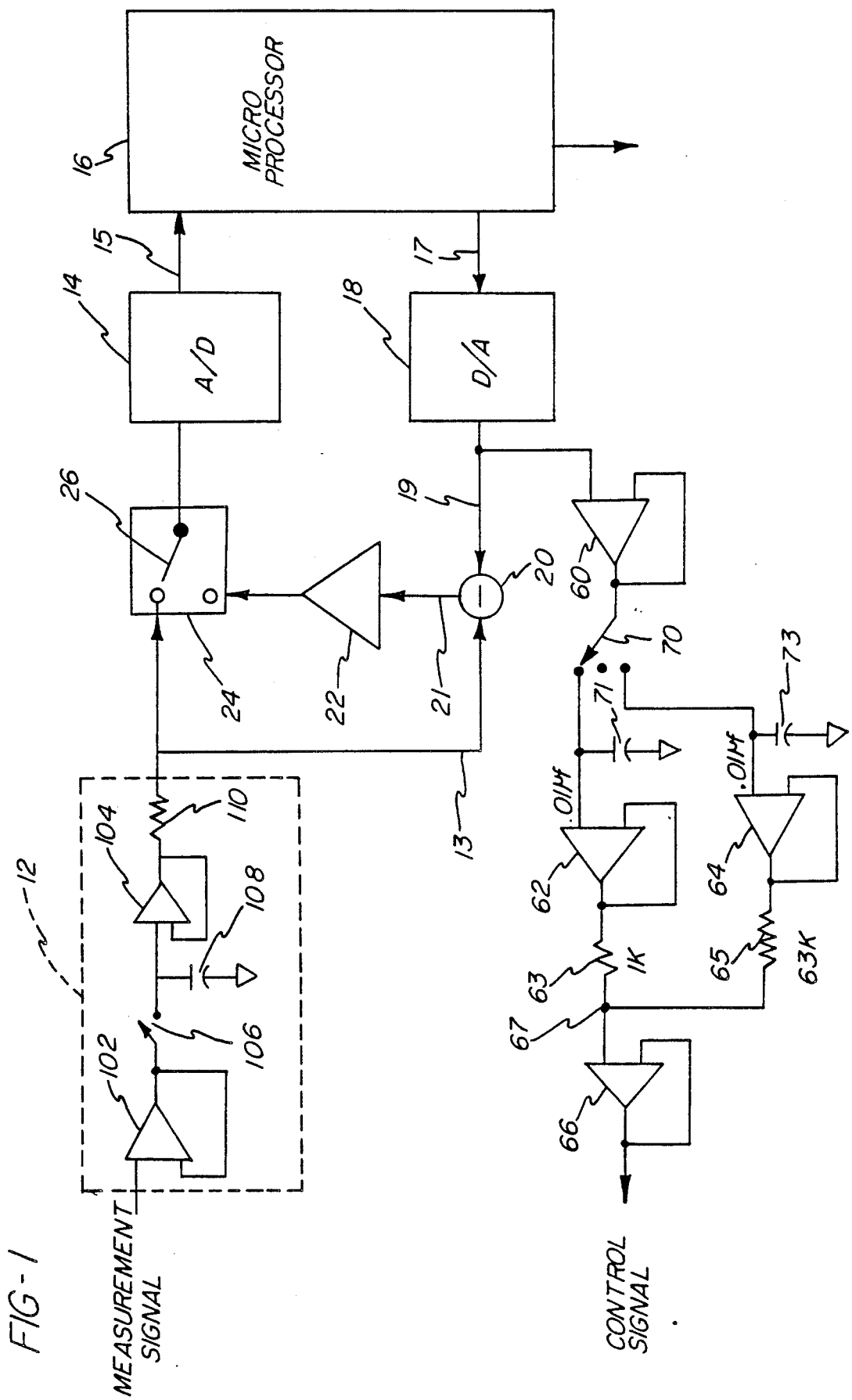
FIG. 1 is a schematic block diagram of a process controller in accordance with the present invention.

A process controller in accordance with the present invention receives an analog measurement signal from a measurement transducer (not illustrated) and processes the measurement signal using an arrangement of components, as illustrated in FIG. 1. The measurement signal is applied to the input of an amplifier 102 which is part of a sample and hold circuit 12. Sample and hold circuit 12 also includes a signal sampling capacitor 108, an amplifier 104 and an output resistor 110. A switch 106 operating under control of microprocessor 16 is periodically closed to provide samples of the measurement signal for storage in capacitor 108. Raw samples of the measurement signal as produced at the output terminal of sample and hold circuit 12 are applied to one input terminal of a switch 26. Switch 26 operates under switching control of microprocessor 16 and has a second input terminal connected to the output terminal of an amplifier 22, the purpose of which will be presently described.

With switch 26 in the position illustrated in FIG. 1, raw samples of the measurement signal are applied to A/D converter 14. In preferred embodiment, A/D converter 14 digitizes the raw samples of the measurement signal into a 10-bit serial format for transmission to microprocessor 16 on line 15. For this purpose, A/D converter 14 may be an integrated circuit Type TLC 1540, available from Texas Instruments Incorporated of Dallas, Tex. Microprocessor 16 has 16-bit data registers and may be an NEC V25 microprocessor available from NEC Electronics, Inc. of Mountain View, Calif. Microprocessor 16 receives 10-bit strings of data from A/D converter 14 and arranges them into 16-bit bytes, as hereinafter described.

The 10-bit representations of the raw samples of the measurement signal are first approximations thereof. These first approximations are used to set the 10 high order bits in 16-bit first stage data bytes temporarily stored in a register in microprocessor 16.

D/A converter 18 reconverts the first approximations into analog form, thereby creating a processed analog signal which differs slightly from the sampling signal produced by sample and hold circuit 12. These differences are due to the rounding errors associated with the digitizing process of A/D converter 14 and with errors in the DAC.

The processed analog signal produced by D/A converter 18 is applied to line 19 for transmission to a comparator 20 and comparison with the raw sampling signal on line 13. In this connection it will be noted that switch 106 is closed momentarily to generate a raw sample and then is held open while that raw sample is digitized, processed in microprocessor 16 and then reconverted to analog form. Thus the processed analog signal on line 19 is associated with a specific raw sample signal on line 13. The difference between those two signals is applied to line 21 for amplification by amplifier 22. In the preferred embodiment described herein amplifier 22 has an amplification factor of 64 which is the 6th power of the number 2.

When microprocessor 16 senses that A/D converter 14 has completed serial transmission of a 10-bit first approximation, it generates a control signal for a switching control transducer (not illustrated) connected to switch 26. This causes switch 26 to toggle from the position illustrated in FIG. 1 to a downward position, thereby connecting the output of amplifier 22 to the input terminal of A/D converter 14. Thus when error signals on line 21 are amplified by amplifier 22, the amplified error signals are digitized to produce a 10-bit refinement. The 10-bit refinement is used to set the 10 low order bits in a 16-bit second stage data word, and a 16-bit error correction term is added to adjust for the errors noted above. Then the second stage data word is added to the first stage data word to obtain an enhanced data word having 16-bit accuracy. As implemented in a working model, the ten bit data strings on line 15 are shifted into the 10 lower bit positions in a 16-bit register, and the first stage data word is constructed by shifting the data in the aforementioned register upwardly six bit positions. This effectively multiplies the number in the first stage data word by a factor of 64 prior to its addition to the second stage data word. Alternatively it is feasible to load the incoming data into the 10 high bit positions of a 16-bit register and thereafter construct the second stage data word by a six-position downward shift (a division by 64).

As noted above, microprocessor 16 adds a correcting term to the first approximations before adding the second stage data word. Such adjustments are accomplished through use of a table lookup routine having 1024 tabulated adjustments corresponding to the 1024 possible values of the first approximation. These adjustments are established by measuring the response of the process controller to an accurately known calibration signal. Once established for a particular hardware unit, the adjustment values need not be changed. Adjustment proceeds by entering the table with the first stage data word as an argument. The resulting adjustment value is added to the second approximation, and the 16-bit sum thereof is added to the first stage data word.

The enhanced data words are used in an appropriate process control equation to generate 16-bit process correction commands which are converted into analog form and transmitted to a set point transducer (not illustrated). The set point transducer in turn controls the physical operation of the process. Analog conversion of the correction commands is performed by A/D 18. Since the conversion by A/D 18 will again introduce known errors, the table lookup routine is used a second time for generation of anticipating adjustment bits to be added to the correction commands.

Microprocessor 16 generates a coarse approximation word which consists of the 10 high order bits of the value to be output. This 10-bit result is used to as an argument for entry into the adjustment table and the tabulated value is added to the low order 6 bits remaining from the 16-bit process correction command. This produces a 10-bit fine correction signal. Since the anticipating adjustments for the correction commands are added to the low order correction word, they are reflected in the fine analog correction signals.

The coarse and fine analog correction signals are applied to output processing circuitry comprising amplifiers 60, 62, 64 and 66, switch 70 and capacitors 71, 73. Switch 70 operates under control of microprocessor 16 to cause alternating sampling of output signals from D/A converter 18. When D/A converter 18 is processing first approximations of the raw sampling signals from sample and hold circuit 12, switch 70 is in the non-operative center position. Thereafter when A/D 18 is generating a coarse analog correction signal, microprocessor 16 switches switch 70 to the upper position as illustrated in FIG. 1. In this position the output of D/A 18 is sampled by capacitor 71, amplified by amplifier 62 and applied to summing junction 67. When this has been completed, microprocessor 16 switches switch 70 to the downward position and sends a low order correction word to D/A 18. This causes production of a fine analog correction signal for amplification and application to capacitor 73. The fine analog correction signal is amplified by amplifier 64 and resistor 65. The amplification factor for the fine analog correction signals is one-64th the amplification factor for the coarse analog correction signals. The fine and coarse analog correction signals are then summed at summing junction 67 and amplified by amplifier 66.

It will be appreciated that the circuitry of FIG. 1 is used repeatedly for each of a number of process channels being monitored and that the output analog circuitry commencing with switch 70 is repeated for each channel being controlled. It should also be appreciated that the error correction table used by microprocessor 16 need not have 1024 tabulated correction values. In particular it has been found that each of the ten bits in the D/A has its own characteristic error, so that the correction table may have 11 values which are selectively read and combined to produce the equivalent of 1024 correction values.

Figure 2:
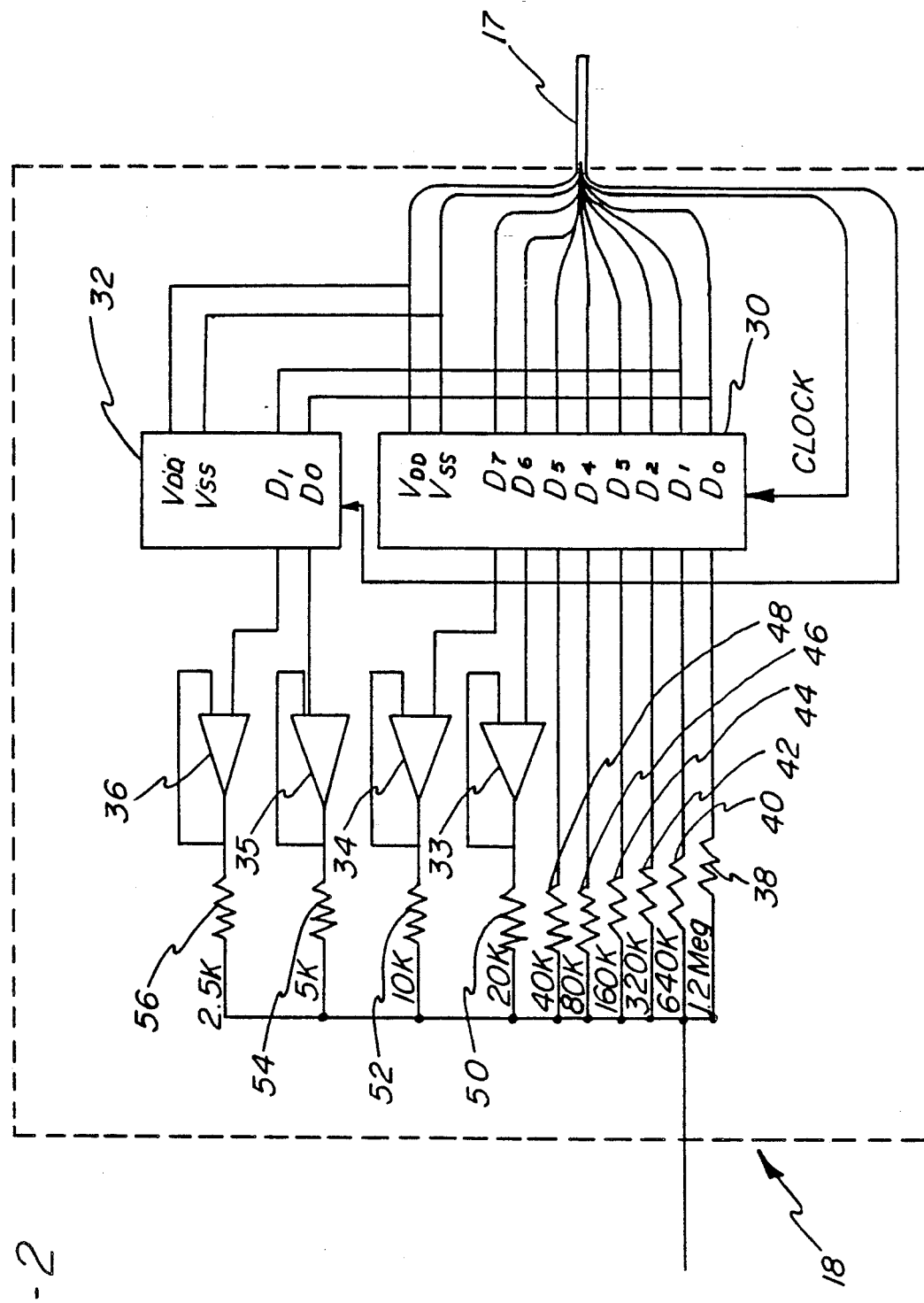
FIG. 2 is a schematic diagram of a 10-bit digital to analog converter.

The design details of D/A converter 18 are illustrated in FIG. 2. The principal components of the D/A converter are a quad 3-state D-type flip-flop 32 connected to operate as a latch and an octal three-state noninverting transparent latch 30. Both are CMOS integrated circuits. IC 32 may be a 74HC173 circuit and IC 30 may be a 74HC373 circuit. Both are available from Motorola Semiconductor Products Inc. of Phoenix, Ariz. These devices comprise field effect transistors having very low resistance. Experiments have shown that the output signals from such devices faithfully follow the voltages of the supply voltages and exhibit extreme stability, even under conditions of substantial changes in ambient temperature.

Ten-bit words from microprocessor 16 are transmitted over data bus 17 in segmented form. The 8 low order bits are transmitted first and latched into latch 30. Thereafter, the two high order bits are transmitted and latched into latch 32. Output signals from these latches are variably attenuated by a resistance ladder comprising resistors 38–56 and are summed for application to output line 19. Amplifiers 33–36 serve as voltage followers for the current supplied to resistors 50–66 effectively reducing the above mentioned field effect transistor resistance. The components comprising D/A 18 are rather inexpensive while being sufficiently stable to enable precision correction of conversion errors.

While the method herein described, and the form of apparatus for carrying this method into effect, constitute preferred embodiments of this invention, it is to be understood that the invention is not limited to this precise method and form of apparatus, and that changes may be made in either without departing from the scope of the invention, which is defined in the appended claims.

What is claimed is:

1. Process control apparatus comprising:
    a sampling circuit for receiving and holding raw samples of an analog measurement signal from a process to be controlled,
    an analog to digital converter connected to said sampling circuit for digitizing said raw samples to create first approximations of said analog signal,
    a digital to analog converter connected for receiving digital information corresponding to said first approximations and producing processed analog samples thereof which differ from said raw samples only by an amount corresponding to the digitizing error in said first approximations, and quantifiable errors in said digital to analog converter,
    a comparator for comparing said processed analog samples against said raw samples and generating an error signal indicating the differences therebetween,
    first amplifying means for amplifying said error signal by a predetermined factor to create an amplified error signal,
    first switching means for alternately applying said raw samples and said amplified error signal to said analog to digital converter, so that said analog to digital converter alternately digitizes said raw samples and said amplified error signal,
    a microprocessor connected to said analog to digital converter for receiving the digitized outputs thereof, combining said outputs to produce enhanced digital data representing said raw samples, processing the enhanced digital data to produce control corrections for said process in byte pairs each comprising a high order byte and a low order byte, and transmitting said pair members in sequence to said digital to analog converter to be converted into corresponding coarse and fine analog correction signals,
    second amplifying means for amplifying said coarse analog correction signals,
    third amplifying means for amplifying said fine analog correction signals,
    second switching means connected to said digital to analog converter for selectively directing said coarse and fine analog correction signals to said second and third amplifying means, and
    a summing junction connected to said second and third amplifying means for summing the amplified outputs thereof to produce an analog control signal for said process.

2. Apparatus according to claim 1 wherein said digital to analog converter is connected for receiving said first approximations from said microprocessor.

3. Apparatus according to claim 1 wherein said microprocessor comprises 16-bit data registers and said analog to digital converter comprises means for digitizing the analog inputs thereof in a 10-bit format and serially transmitting said data to said microprocessor.

4. Apparatus according to claim 1 wherein said digital to analog converter comprises data latching means having a plurality of input terminals connected in parallel to said microprocessor for generating a plurality of latched data indicating signals corresponding to data bits output by said microprocessor, a resistance ladder for attenuating said data indicating signals by progressively decreasing amounts, and means for summing said indicating signals as progressively attenuated.

5. Method of controlling an industrial process comprising the steps of:
    measuring a condition of said process and generating an analog measurement signal corresponding thereto,
    sampling said measurement signal and holding raw samples thereof,
    digitizing said raw samples to create first approximations of said analog signal in a format having a predetermined number of bits,
    using said first approximations to set bit values in the upper bit positions of first stage data words having more bit positions than said predetermined number,
    producing a processed analog signal by converting said first approximations into analog form,
    comparing said processed analog signal against said raw samples and generating an error signal indicating the difference therebetween,
    amplifying said error signal by a predetermined factor to create an amplified error signal,
    digitizing said amplified error signal to produce digitized refinements having said predetermined number of bits,
    using said refinements to set bit values in the lower bit positions of second stage data words having more bit positions than said predetermined number,
    adding said second stage data words to said first stage data words to produce enhanced data words having an accuracy greater than that of said first approximations,
    using said enhanced data words to generate correction commands for said process,
    formatting said correction commands into word pairs comprising high order correction words and low order correction words,
    converting said high order and low order correction words into a coarse analog correction signal and a fine analog correction signal,
    separately amplifying said coarse analog correction signal and said fine analog correction signal by different amplification factors, and
    summing said amplified coarse and fine analog correction signals to produce an analog control signal for said process.

6. Method according to claim 5 further comprising the step of adding predetermined adjustments to said correction commands to compensate for anticipated errors during analog conversion thereof.

7. Method according to claim 6 further comprising the step of creating a table of adjustment valves representing known errors associated with analog conversion of said correction words; said adjustments being read from said table in accordance with the values of said high order correction words and thereafter added to the values of said low order correction words.

8. Method according to claim 7 further comprising the steps of using said table to read adjustment values for said first approximation and adding said adjustment values to said first approximations prior to conversion thereof into analog form.

* * * * *